(12) United States Patent
Inoue et al.

(10) Patent No.: US 7,541,721 B2
(45) Date of Patent: Jun. 2, 2009

(54) ACOUSTIC WAVE DEVICE (75) Inventors: Kazunori Inoue, Kawasaki (JP);
Takashi Matsuda, Kawasaki (JP);
Jyouji Kimura, Yokohama (JP)

(73) Assignees: Fujitsu Media Devices Limited, Yokohama (JP); Fujitsu Limited, Kawasaki (JP)

( * ) Notice: Subject to any disclaimer, the term of this patent is extended or adjusted under 35 U.S.C. 154(b) by 0 days.

(21) Appl. No.: 11/941,522

(22) Filed: Nov. 16, 2007

(65) Prior Publication Data

US 2008/0116762 A1 May 22, 2008

(30) Foreign Application Priority Data

Nov. 17, 2006 (JP) ............... 2006-311548

(51) Int. Cl.
*H01L 21/00* (2006.01)
*H01L 41/047* (2006.01)
*H03H 9/25* (2006.01)

(52) U.S. Cl. .................... 310/365; 310/313 R
(58) Field of Classification Search ............. 310/313 R, 310/365
See application file for complete search history.

(56) References Cited

U.S. PATENT DOCUMENTS

| 6,605,522 B1 * | 8/2003 | Ezawa et al. ............... 438/613 |
| 7,205,700 B2 * | 4/2007 | Yamato .................. 310/313 B |
| 7,253,553 B2 * | 8/2007 | Sasaki ...................... 310/365 |
| 7,345,411 B2 * | 3/2008 | Sato et al. .................. 310/365 |

FOREIGN PATENT DOCUMENTS

| JP | 03-293740 | * | 12/1991 |
| JP | 08-236576 A | * | 3/1996 |
| JP | 9-213743 A | | 8/1997 |
| JP | 10-13012 A | | 1/1998 |
| JP | 2004-296497 A | | 10/2004 |

* cited by examiner

*Primary Examiner*—Thomas M Dougherty
(74) *Attorney, Agent, or Firm*—Arent Fox LLP (57) ABSTRACT

An acoustic wave device includes an acoustic wave element formed on a piezoelectric substrate, and a terminal that makes an electric connection with an outside of the acoustic wave device. The terminal has a protrusion electrode having a side surface coated with a coating film having a non-coating portion.

9 Claims, 9 Drawing Sheets

DIRECTION IN WHICH SOLDER FLOWS OUT

ACOUSTIC WAVE DEVICE

TECHNICAL FIELD

The present invention relates to acoustic wave devices, and more particularly, to an acoustic wave device in which protrusion electrodes that form terminals have side surfaces covered with a coating member.

BACKGROUND OF THE INVENTION

An acoustic wave device equipped with comb electrodes is known as an acoustic wave device utilizing an acoustic wave. The comb electrodes are formed by an IDT (Interdigital Transducer) on a surface of a piezoelectric substrate, and are supplied with electric power, so that an acoustic wave can be excited. The acoustic wave device is widely used in various circuits processing radio signals in a frequency band ranging from 45 MHz to 2 GHz, such as a bandpass filter for transmission, a bandpass filter for reception, and an antenna duplexer. Recently, an acoustic wave device using a piezoelectric thin-film resonator has been employed in practical use. An exemplary piezoelectric thin-film resonator is an FBAR (Film Bulk Acoustic Resonator) in which electrodes are provided on opposite surfaces of a piezoelectric substrate so as to face each other. The piezoelectric substrate vibrates in the thickness direction. The device using the piezoelectric thin-film resonator exhibits good characteristics at higher frequencies and is used in a frequency range of 1 GHz to 10 GHz.

Recently, it has been required to downsize signal processing devices and to thus reduce acoustic wave devices used therein. Particularly, module devices are frequency employed in portable electronic devices such as cellular phones, and surface mountable compact devices are demanded. The acoustic wave devices need a cavity above a functioning portion that is essential to maintain desired characteristics. Such a functioning portion is comb electrodes for the surface acoustic wave device, and is a region in which upper and lower electrodes face each other across a piezoelectric thin film for the piezoelectric thin-film resonator. Such a cavity is defined in the wafer state in order to satisfy demands for downsizing. The acoustic wave device thus formed may be used as a module component by flip-chip mounting it on an electronic circuit board and sealing it with resin for transfer mold. The electronic circuit board may be a board having wiring or interconnections for forming an electronic circuit, such as a printed circuit board or a module board.

Figure 1:
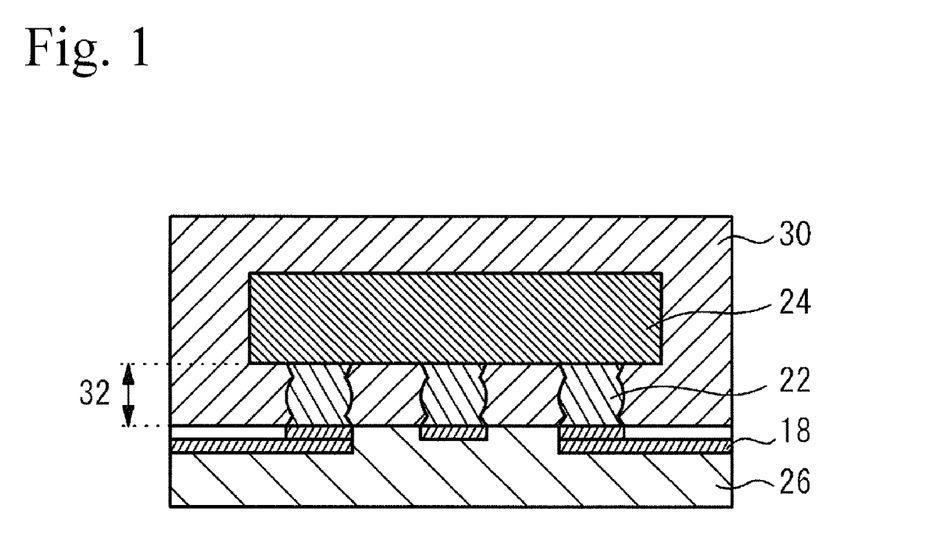
FIG. 1 is a cross-sectional view of an acoustic wave device mounted on an electronic circuit board.

FIG. 1 is a cross-sectional view of an acoustic wave device mounted on an electronic circuit board. Referring to FIG. 1, an acoustic wave device 24 is flip-chip mounted on interconnection or wiring lines 18 of an electronic circuit board 26 by protrusion electrodes 22 formed on the acoustic wave device 24 and made of solder. A gap between the acoustic wave device 24 and the electronic circuit board 26 is defined as standoff 32. The height of the standoff 32 is defined by the protrusion electrodes 22. The acoustic wave device 24 is hermetically sealed with resin 30 for transfer mold.

Various ways to control the height of the standoff 32 have been proposed. Japanese Patent Application Publication Nos. 10-13012 (Document 1) and 9-213743 (Document 2) propose to use a spacer separate from the protrusion electrodes 22 between the acoustic wave device 24 and the electronic circuit board 26. The spacer functions to control the height of the standoff 32.

The technique of using a solder ball including an embedded resin core has been developed. The solder balls are used to flip-chip mount the acoustic wave device 24 on the electronic circuit board 26. The solder balls function as a spacer to control the height of the standoff 32.

Figure 2:
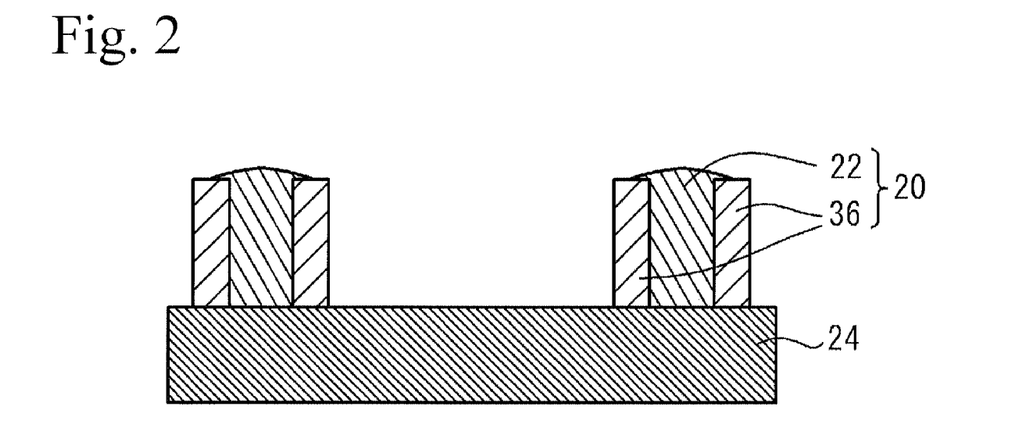
FIG. 2 is a cross-sectional view of an acoustic wave device of a first related art.

Japanese Patent Application Publication No. 2004-296497 (Document 3) discloses a technique of covering side surfaces of the protrusion electrodes 22 with a resin layer. FIG. 2 is a cross-sectional view of an acoustic wave device (first related art) having the protrusion electrodes 22 made of solder in which the side surfaces thereof are covered with a resin layer. The protrusion electrodes 22 of solder are attached to the acoustic wave device 24. The side surfaces of the protrusion electrodes 22 are covered with resin layers 36. When the acoustic wave device of the first conventional art is flip-chip mounted on the electronic circuit board 26, the protrusion electrodes 22 that defines the height of the standoff 32 are covered with the resin layers 36, which function as a spacer and controls the height of the standoff 32.

SUMMARY OF THE INVENTION

According to an aspect of the present invention, there is provided an acoustic wave device capable of precisely controlling the height of a standoff between an acoustic wave device and an electronic circuit board.

According to a more specific aspect of the present invention, there is provided an acoustic wave device including: an acoustic wave element formed on a piezoelectric substrate; and a terminal that makes an electric connection with an outside of the acoustic wave device, the terminal having a protrusion electrode having a side surface coated with a coating film having a non-coating portion.

DESCRIPTION OF THE PREFERRED EMBODIMENTS

In order to facilitate better understanding the present invention, a description will be given of related art.

Figure 3:
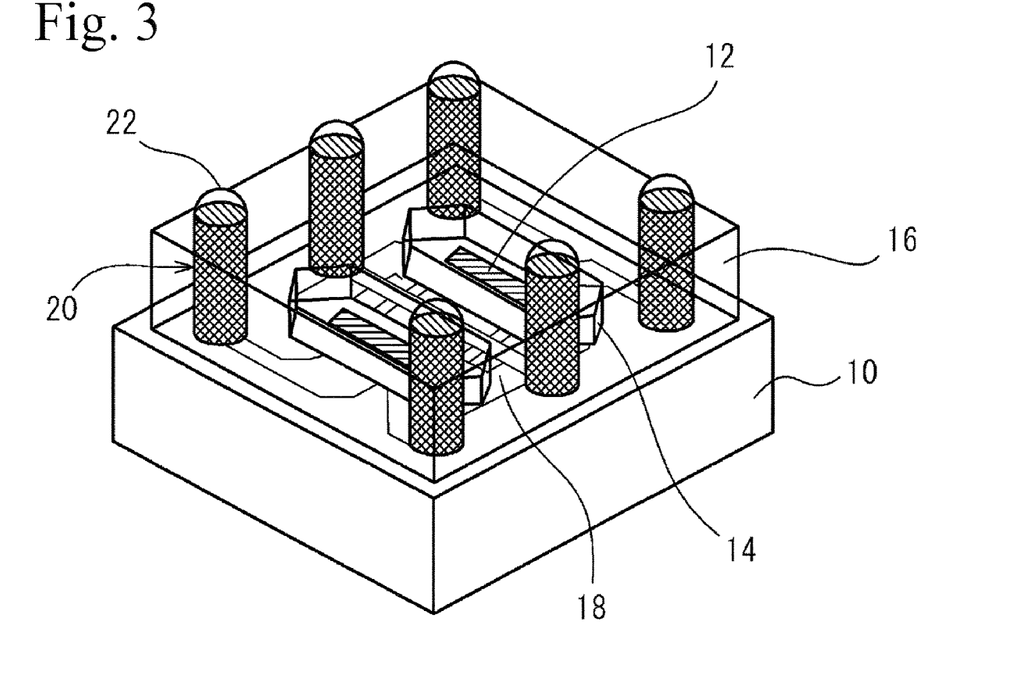
FIG. 3 is a perspective view of a surface acoustic wave device of a second related art.

The acoustic wave device may have pins as small as six to ten, the pins being used for making electric connections with an outside of the device such as an external circuit. FIG. 3 is a perspective view of an acoustic wave device (second related art) in which surface acoustic wave elements 12, wiring lines 18, cavities 14 and terminals 20 are seen through a seal layer 16. The surface acoustic wave elements 12 and the wiring lines 18 are formed on a piezoelectric substrate 10. The surface acoustic wave elements 12 are composed of comb electrodes and reflection electrodes formed by a metal film on the piezoelectric substrate 10. The seal layer 16, which has cavities 14 located above the function portions of the surface acoustic wave elements 12, is provided on the piezoelectric substrate 10. The terminals 20 are mounted on the piezoelectric substrate 10 and are penetrated through the seal layer 16. The terminals 20 have protrusion electrodes 22, which protrude from the seal layer 16. The terminals 20 function to electrically connect the surface acoustic wave elements 12 with an external circuit via the wiring lines 18.

The acoustic wave device thus formed has a small number of terminals 20. An underfill, which is expensive, is not formed between the acoustic wave device 24 and the electronic circuit board 26 in the flip-chip mounting, but resin 30 for transfer mold is rather formed therebetween. In order for the resin 30 for transfer mold to reliably go round the space between the acoustic wave device 24 and the electronic circuit board 26, it is necessary to increase the height of the standoff 32 between the acoustic wave device 24 and the electronic circuit board 26. Generally, the height of the standoff 32 is as high as 50-150 μm.

The acoustic wave device is an RF device, and a change of the height of the standoff 32 causes a change of the length of the transmission line over which a signal is transmitted within the acoustic wave device, and causes a change of the module performance. It is thus required to strictly control the height of the standoff 32.

For example, the methods for controlling the height of the standoff 32 disclosed in Documents 1 and 2 require the use of the spacers separate from the solder protrusion electrodes 22 between the acoustic wave device 24 and the electronic circuit board 26 in the mounting process. This increases the production cost.

The method to use the solder balls having embedded resin cores to control the height of the standoff 32 has a problem about difficulties in producing the solder balls having a diameter as small as 100 μm or less and in mounting with such small solder balls.

Figure 4:
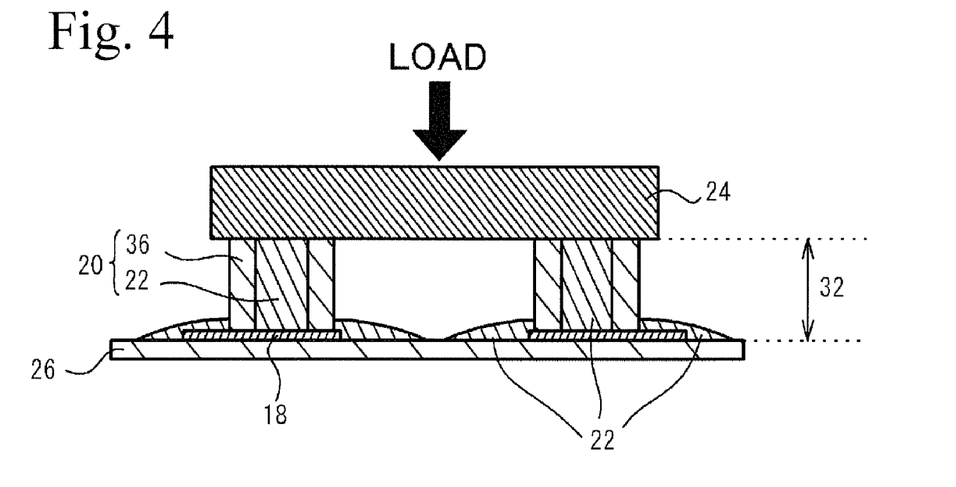
FIG. 4 is a cross-sectional view that illustrates a problem when the acoustic wave device of the first related art is mounted on the electronic circuit board.

The method to use the resin layers 36 that covers the side surfaces of the protrusion electrodes 22 to thus control the height of the standoff 32 disclosed in Document 3 has the following problem, which will be described with reference to FIG. 4. When the acoustic wave device of the first related art is flip-chip mounted on the electronic circuit board 26, reflow may be used while applying a load onto the acoustic wave device 24 in order to precisely control the height of the standoff 32. However, solder may flow over in every direction because the whole side surfaces of the solder protrusion electrodes 22 are covered with the resin layers 36. Thus, the terminals 20 may be short-circuited.

The present invention has been made in view of the above circumstances. According to an aspect of the present invention, there is provided an acoustic wave device capable of preventing terminals for making external connections from being short-circuited in reflow with a load being applied to the acoustic wave device.

First Embodiment

Figure 5A:
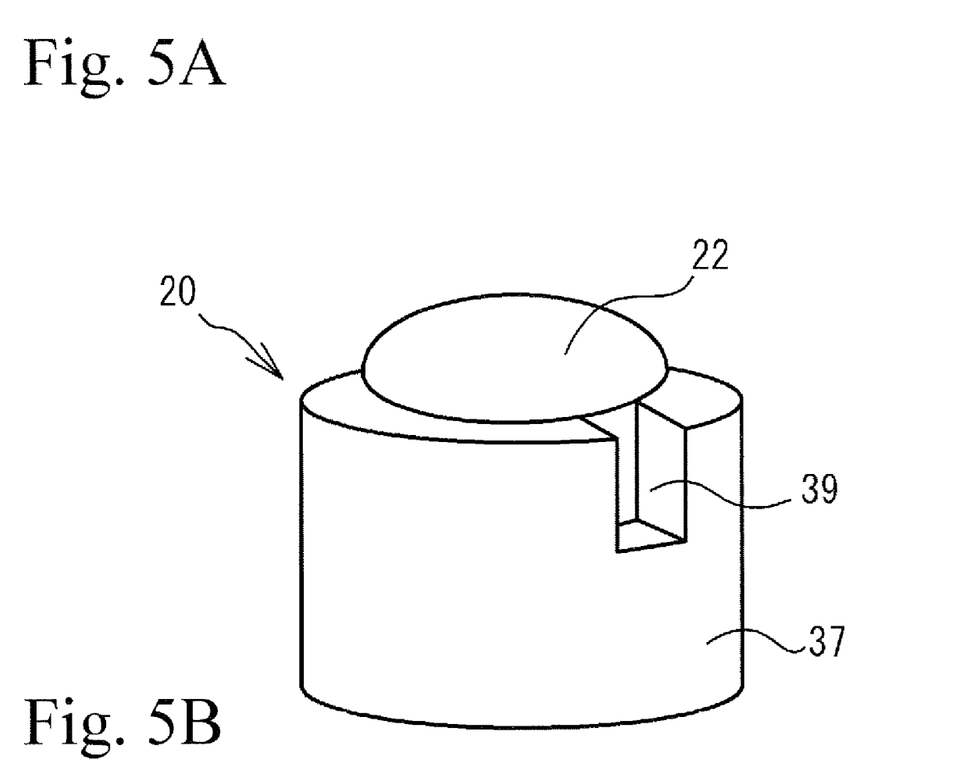
FIG. 5A is a perspective view of a terminal employed in a surface acoustic wave device in accordance with a first embodiment.
Figure 5B:
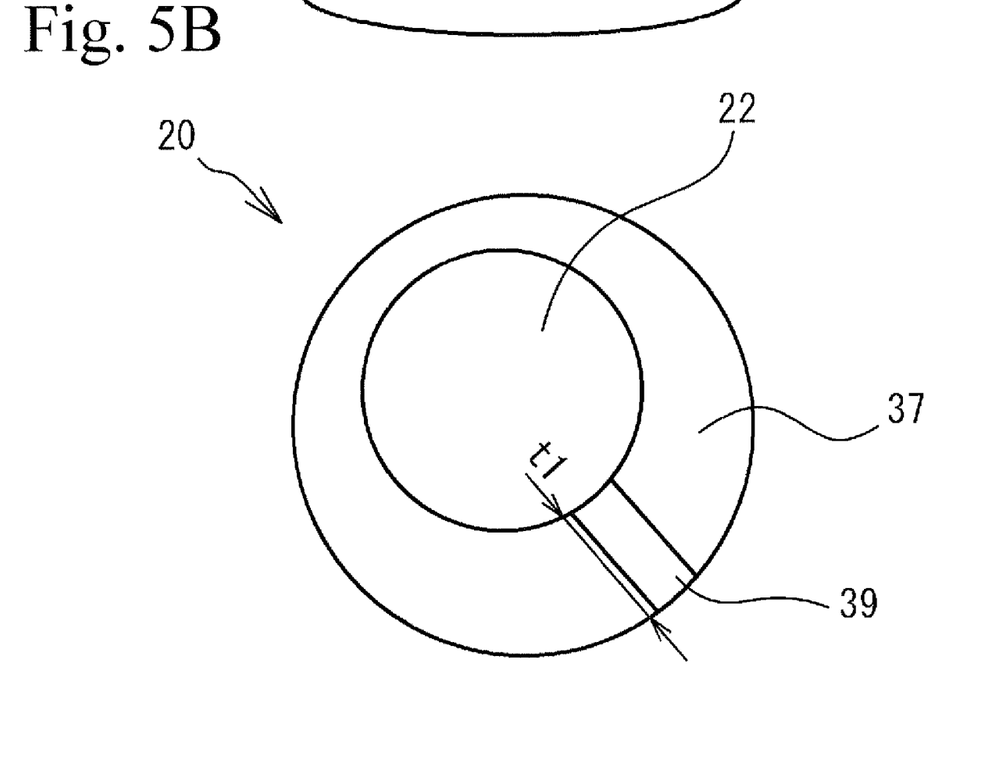
FIG. 5B is a plan view of the terminal shown in FIG. 5A.

FIG. 5A shows a perspective view of an improved terminal 20 employed in an acoustic wave device in accordance with a first embodiment, and FIG. 5B is a top view thereof. Referring to these figures, the terminal 20 has a coating layer 37, which is provided so as to cover side surfaces of the protrusion electrode 22 made of solder and has a higher melting point than that of the solder protrusion electrode 22. The coating layer 37 may be formed by photosensitive epoxy resin or photosensitive polyimide resin having no melting point. That is, the shape of the coating layer 37 can be maintained even when the protrusion electrode 22 is melted. The coating layer 37 may be 50 to 150 μm high. The protrusion electrode 22 is raised over the coating layer 37. The protrusion electrode 22 may have a diameter of 100 μm, and the coating layer 37 has a diameter of 200 to 300 μm. The coating portion 37 has a non-coating portion 39 like a cutout form. The side surface of the protrusion electrode 22 is exposed through the non-coating portion 39. The coating layer 37 has a thickness t1 in a region that the non-coating portion 39 faces, the thickness t1 being greater than a thickness of another portion of the coating layer 37 that does not contacts the non-coating portion 39.

Figure 6A:
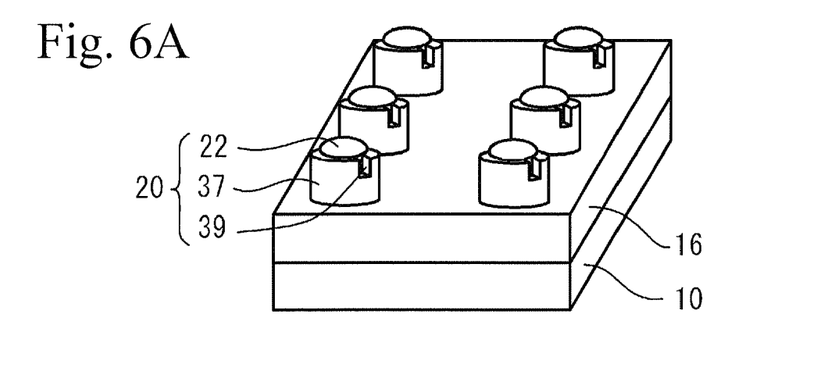
FIG. 6A is a perspective view of the surface acoustic wave device in accordance with the first embodiment.
Figure 6B:
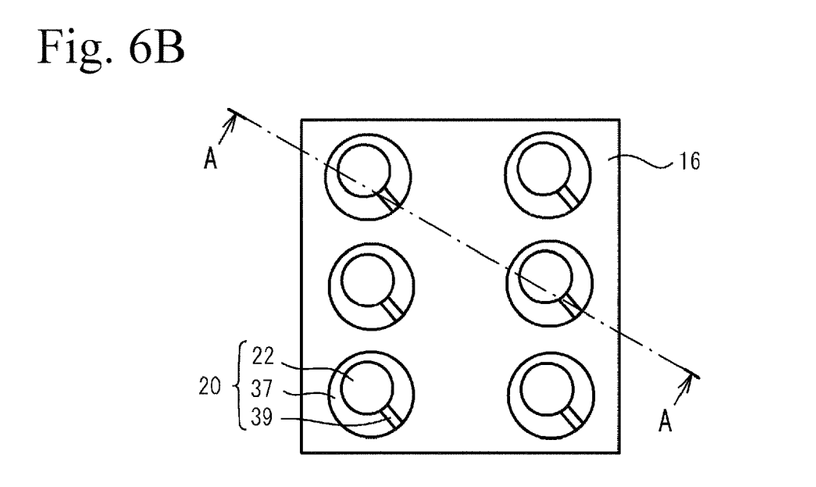
FIG. 6B is a top view of the device shown in FIG. 6A.
Figure 6C:
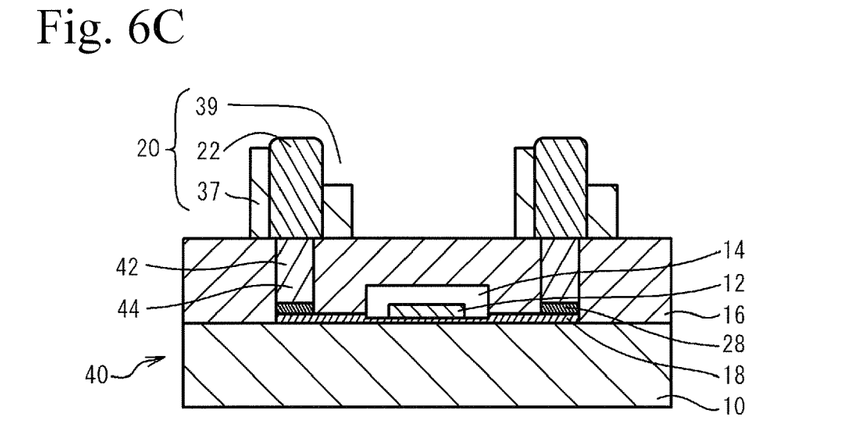
FIG. 6C is a cross-sectional view taken along a line A-A shown in FIG. 6B.

FIGS. 6A through 6C show an acoustic wave device in accordance with the first embodiment. More specifically, FIG. 6A is a perspective view of the acoustic wave device, FIG. 6B is a top view thereof, and FIG. 6C is a cross-sectional view taken along a line A-A shown in FIG. 6B. As shown in FIG. 6C, the surface acoustic wave element 12 and the wiring lines 18 are provided on the piezoelectric substrate 10. The seal layer 16 having the cavity 14 located above the element 12 is provided on the piezoelectric substrate 10. Holes 42 are formed in the seal layer 16 and are located above the wiring lines 18. Pad electrodes 28 are provided on the wiring lines 18 and are located in the holes 42. Barrier metals 44, which may be made of nickel (Ni) or copper (Cu), are embedded in spaces above the pad electrodes 28 in the holes 42. The terminals 20 are provided on the barrier metals 44, which are provided to prevent the pad electrodes 28 from being corroded by solder of the protrusion electrodes 22.

As shown in FIGS. 6A and 6B, the non-coating portions 39 of the terminals 20 having a cutout shape are all oriented in an identical direction.

Figure 7A:
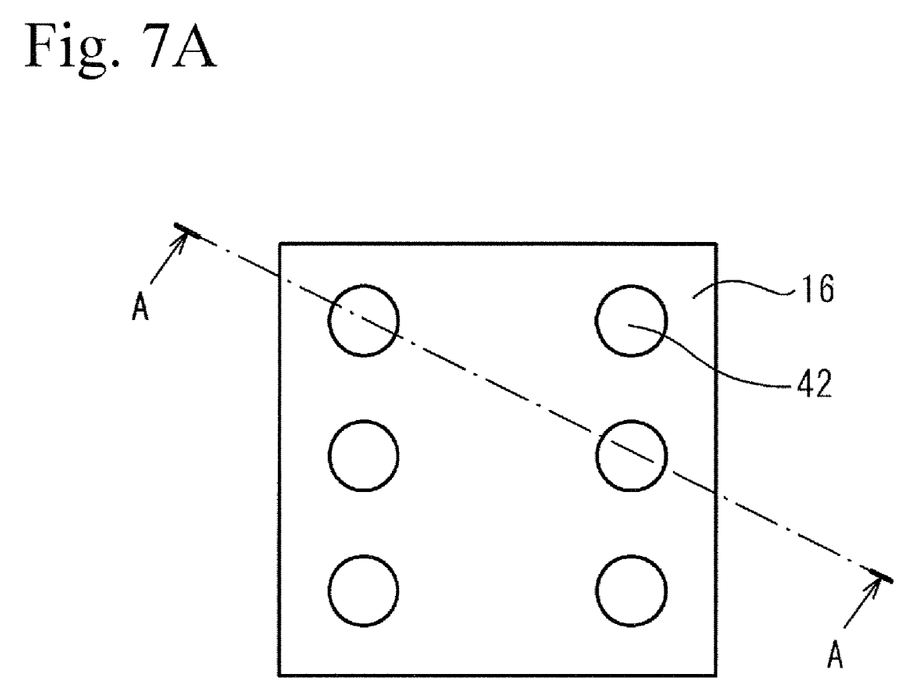
FIG. 7A is a top view of the surface acoustic wave device in accordance with the first embodiment shown in FIG. 8A.
Figure 8A:
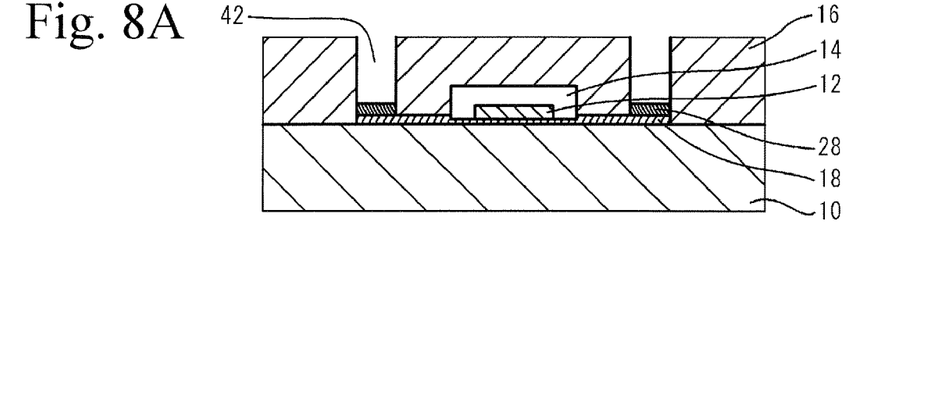
FIGS. 8A through 8C show a sequence of a method for fabricating the surface acoustic wave device in accordance with the first embodiment.

A description will now be given, with reference to FIGS. 7A through 9C, of a method for fabricating the acoustic wave device in accordance with the first embodiment. FIG. 7A shows the device before the terminal 20 are formed. FIG. 8A is a cross-sectional view taken along a line A-A shown in FIG. 7A. FIGS. 8B through 9C show fabrication processes with cross sections taken along the line A-A shown in FIG. 7A. As shown in FIG. 8A, a first layer portion of the seal layer 16 is provided on the piezoelectric substrate 10 except the cavity 14 and holes 42, and has the same height as that of the cavity 14 provided above the function portion of the acoustic wave element 12. Then, a film-like second portion of the seal layer 16 is provided on the first portion, so that the cavity and the holes 42 can be defined as shown in FIG. 8A.

Figure 8B:
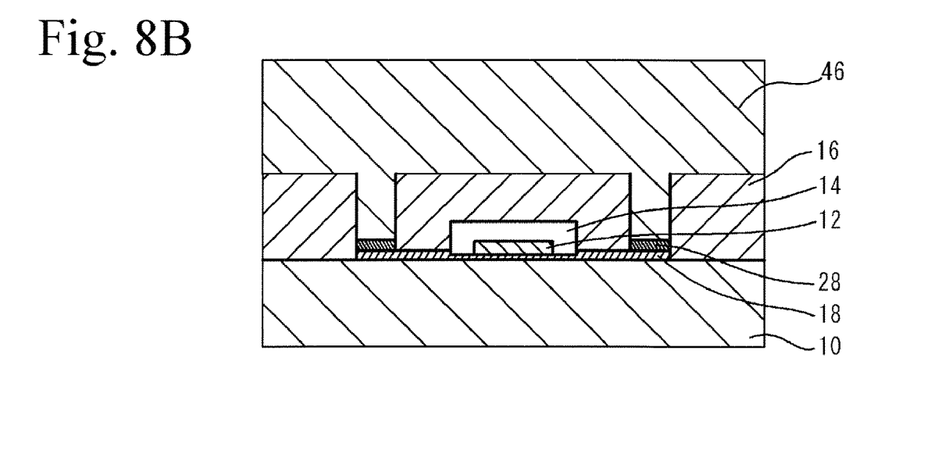

As shown in FIG. 8B, a photosensitive resin layer 46 made of photosensitive epoxy resin or photosensitive polyimide resin is coated on the seal layer 16. Alternatively, a film-like photosensitive region layer 46 may be attached to the seal layer 16.

Figure 8C:
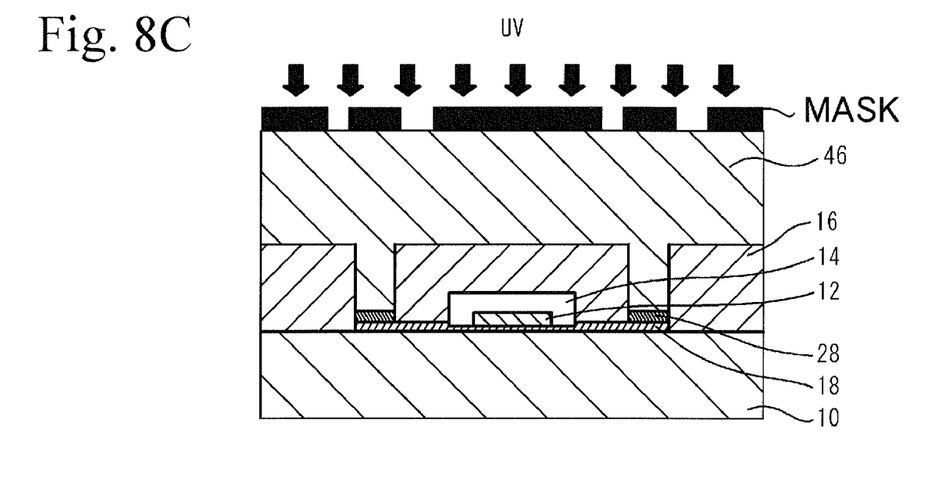

As shown in FIG. 8C, a mask for defining the non-coating portion 39 of the coating layer 37 is attached to the photosensitive resin layer 46, and ultraviolet light is projected onto the photosensitive resin layer 46.

Figure 7B:
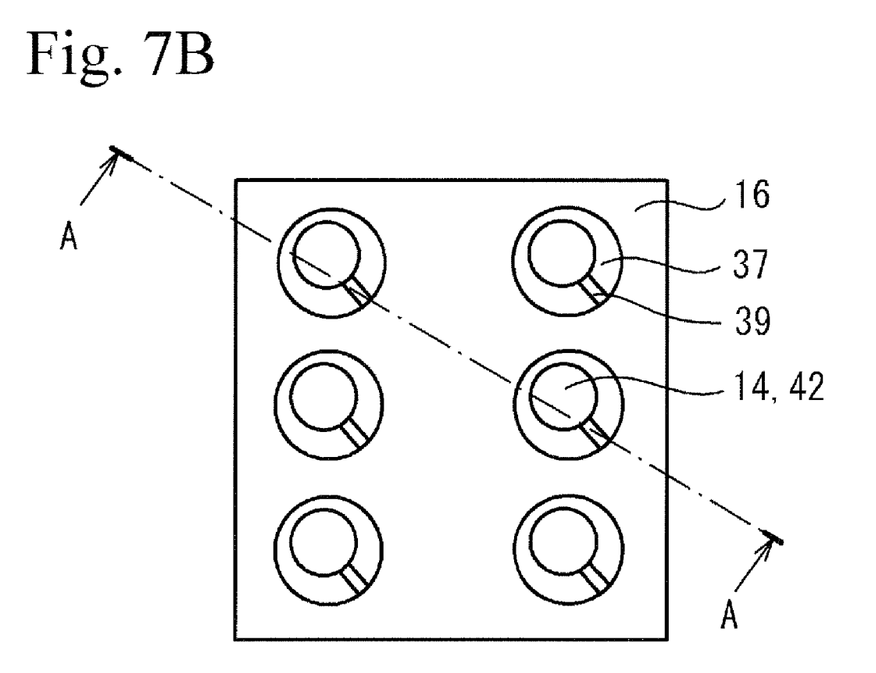
FIG. 7B is a top view of the surface acoustic wave device in accordance with the first embodiment shown in FIG. 9A.
Figure 9A:
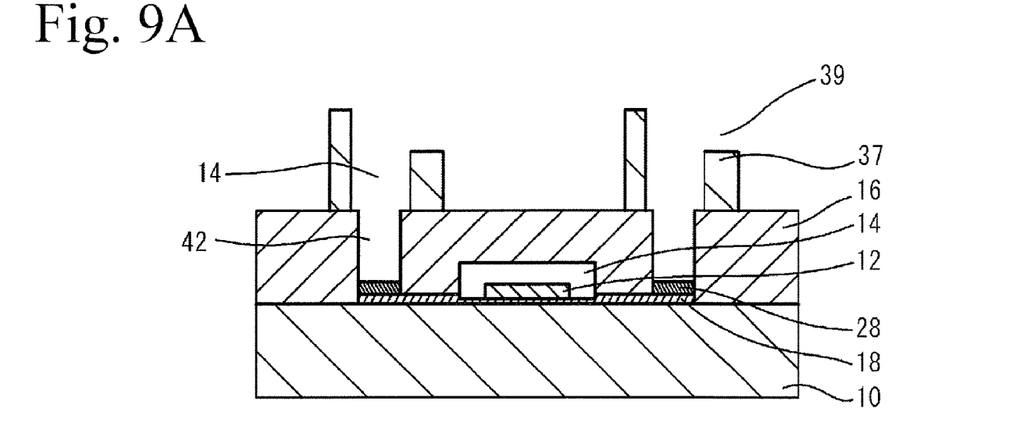
FIGS. 9A through 9C show a subsequent sequence of the method.

As shown in FIG. 9A, the photosensitive resin layer 46 is developed to remove portions thereof onto which the ultraviolet light is not projected. The remaining photosensitive resin layer 46 is heated to be hardened, so that the coating layer with the non-coating portion 39 having the cutout shape can be defined. FIG. 7B is a top view of the device shown in FIG. 9A. A sequence of coating or attaching, exposing, developing and hardening the photosensitive resin layer 46 by heat treatment may be repeatedly performed several times taking into consideration the shape of the coating layer 37. When the coating layer 37 is formed by repeatedly performing the sequence, the hardening of the photosensitive resin layer 46 by heat treatment may be performed only in the final cycle of the repetitive sequence.

Figure 9B:
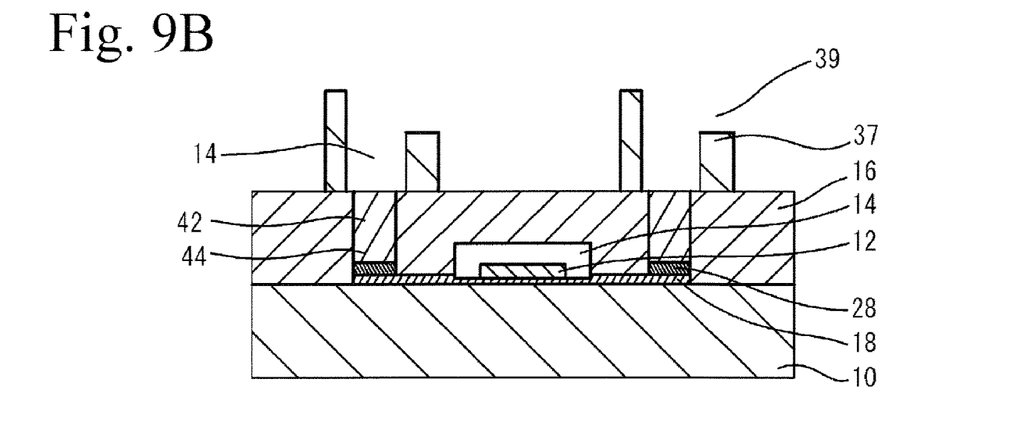

Referring to FIG. 9B, the barrier metals 44 made of Ni or Cu are formed on the pad electrodes 28 in the holes 42 formed in the seal layer 16 by plating.

Figure 9C:
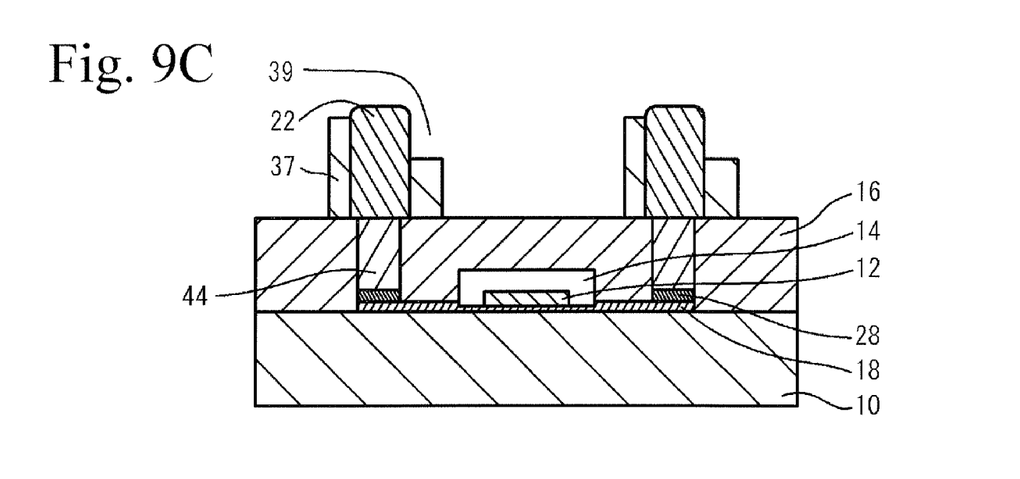

As shown in FIG. 9C, the protrusion electrodes 22 made of solder are formed in the cavities 14 surrounded by the coating layers 37 by plating. The solder protrusion electrodes 22 may be formed so as to be raised over the coating layer 37. Thus, the acoustic wave device of the first embodiment is thus obtained. When the solder protrusion electrodes 22 are formed in the cavities 14, it is preferable to anisotropically plate the cavities 14 in which solder is vertically grown at a rate of growth higher than that at which solder is laterally grown in order to prevent solder from being in the non-coating portion 39 having the cutout shape.

Figure 10A:
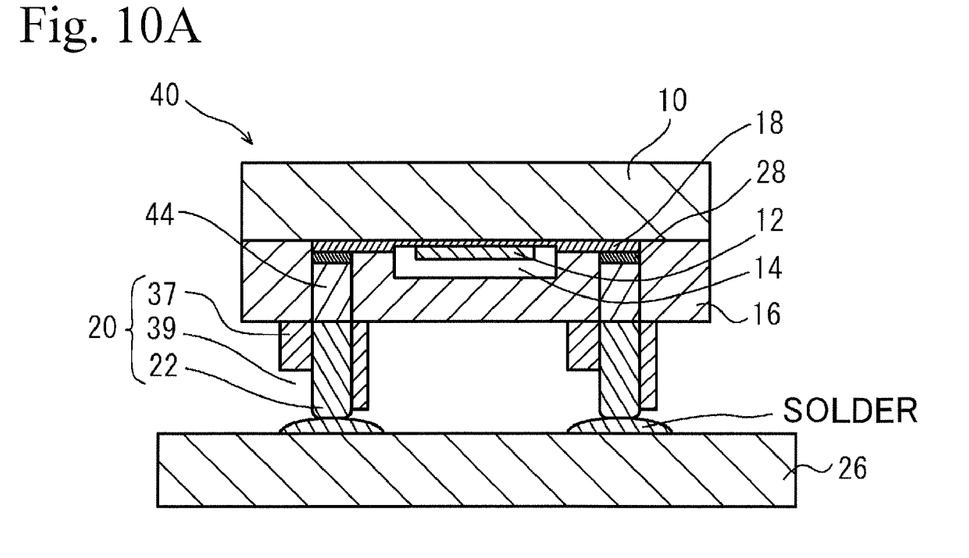
FIGS. 10A and 10B show effects brought by the surface acoustic wave device in accordance with the first embodiment.
Figure 10B:
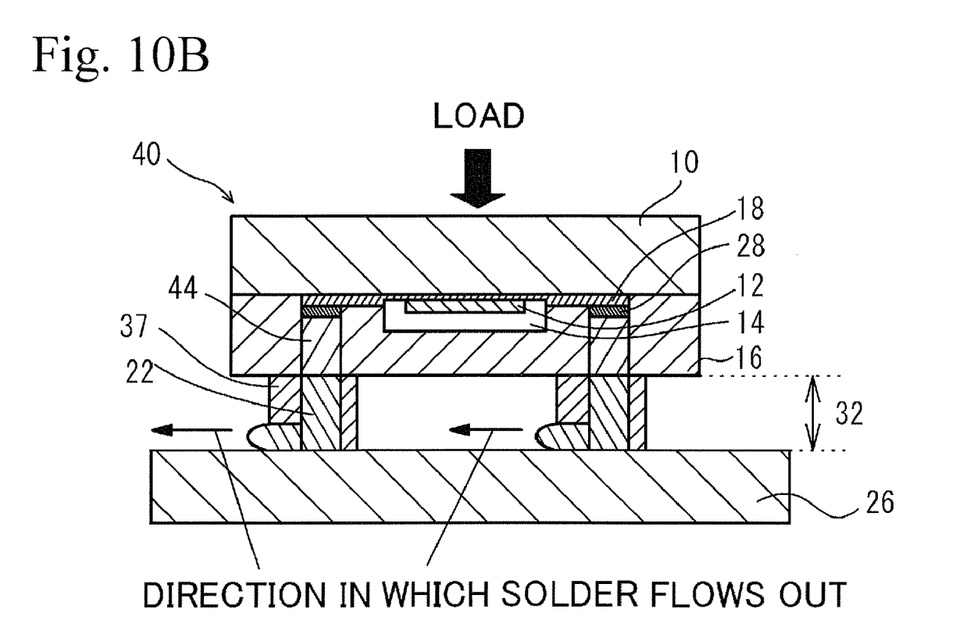

FIGS. 10A and 10B show effects brought by the acoustic wave device in accordance with the first embodiment. More specifically, FIG. 10A is a cross-sectional view the acoustic wave device of the first embodiment that is flip-chip mounted on the electronic circuit board 26 before reflow of solder is performed. FIG. 10B is a cross-sectional view of the acoustic wave device of the first embodiment that is flip-chip mounted on the electronic circuit board 26 after reflow of solder is performed with a load being applied to the device.

As shown in FIG. 10B, in order to precisely control the height of the standoff 32 between the acoustic wave device 40 and the electronic circuit board 26, the solder reflow is performed with a load being applied to the device 40. The protrusion electrodes 22 made of solder are melted, while the shape of the coating layer 37 is maintained because the coating layer 37 is made of photosensitive epoxy resin or photosensitive polyimide resin having a higher melting point than that of the solder protrusion electrodes 22 or having no melting point. The non-coating portions 39 are formed in the coating layers 37, so that solder primarily flows out of the non-coating portions 39 having the cutoff shape. Thus, it is possible to control the direction in which solder flows out. The non-coating portions 39 of the coating layers 37 may be oriented in an identical direction. It is thus possible to prevent solder flowing out of the non-coating portions 38 from contacting each other and to thus prevent the adjacent terminals 20 from being short-circuited.

In the above-mentioned embodiment, the non-coating portions 39 formed in the coating layers 37 are not limited to the identical direction. For example, the non-coating portions 39 formed in the adjacent coating layers 37 are arranged so as not to face each other. This arrangement prevents solder flowing out of adjacent non-coating portions 39 from contacting each other and prevents short-circuiting between them.

According to the first embodiment, the coating layer 37 has a greater thickness t1 in the region that the non-coating portion 39 contacts than that of another region that does not contact the non-coating portion 39. It is thus possible to reduce the amount of solder flowing out of the non-coating portions 39 and more reliably prevent short-circuiting between the adjacent terminals 20.

The coating layers 37 are limited to photosensitive epoxy region or photosensitive polyimide but employ an arbitrary material that makes it possible to maintain the shape when the protrusion electrodes 22 are melted. More preferably, photosensitive resin is used because the coating layers 37 may be shaped easily.

The protrusion electrodes 22 of the first embodiment are not limited to solder but may be made of another material. However, the protrusion electrodes 22 are preferably made of a material that is melted in reflow of solder. The use of such a material makes it possible to control the direction in which the solder flows out of the protrusion electrodes 22 in the reflow process and prevent short-circuiting between the protrusion electrodes 22. In addition, the protrusion electrodes 22 of solder may easily be formed in the cavities defined by the coating layer 37.

The terminals 20 of the acoustic wave devices may be formed simultaneously in the unit of wafer. It is thus possible to easily and economically produce the acoustic wave devices, as compared to the related arts using the spacers as described in Documents 1 and 2. Further, the first embodiment does not need the solder balls having the built-in resin cores in the flip-chip mounting and is thus less expensive.

The first embodiment is not limited to the surface acoustic wave devices having the terminals 20 including the protrusion electrodes 22 having the side surfaces covered with the coating layers 37 having the non-coating portions 39, but may include boundary acoustic wave devices or acoustic wave devices having piezoelectric resonators. In these variations, advantages similar to those of the first embodiment can be obtained.

Second Embodiment

Figure 11:
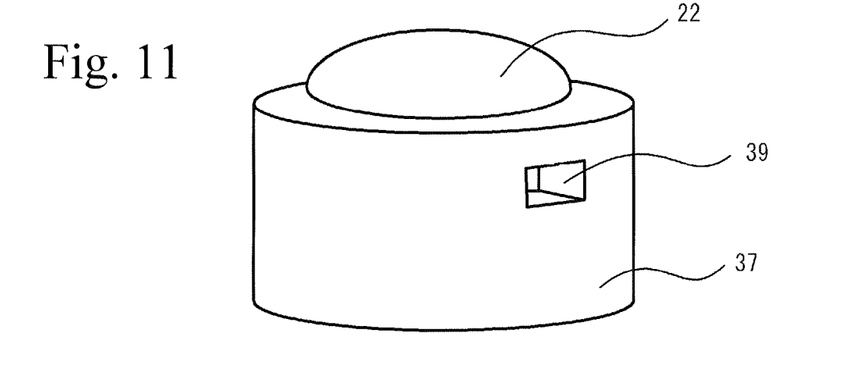
FIG. 11 is a perspective view of a terminal employed in a surface acoustic wave device in accordance with a second embodiment.

FIG. 11 is a perspective view of a structure of the terminal 20 employed in a second embodiment. The terminal 20 shown in FIG. 11 has the non-coating portion 39 formed by a through hole through which the side surface of the protrusion electrode 22 is exposed. The other structures of the terminal 20 shown in FIG. 11 are the same as those of the first embodiment shown in FIGS. 5A and 5B.

The acoustic wave device 40 of the second embodiment is mounted on the electronic circuit board 26 and solder reflow is performed with a load being applied to the device 40. Solder primarily flows out of the through hole of the non-coating portion 39, which does not contact the electronic circuit board 26. It is thus difficult for solder to make the electronic circuit board 26 and prevent short-circuiting between the terminals 20.

Third Embodiment

Figure 12:
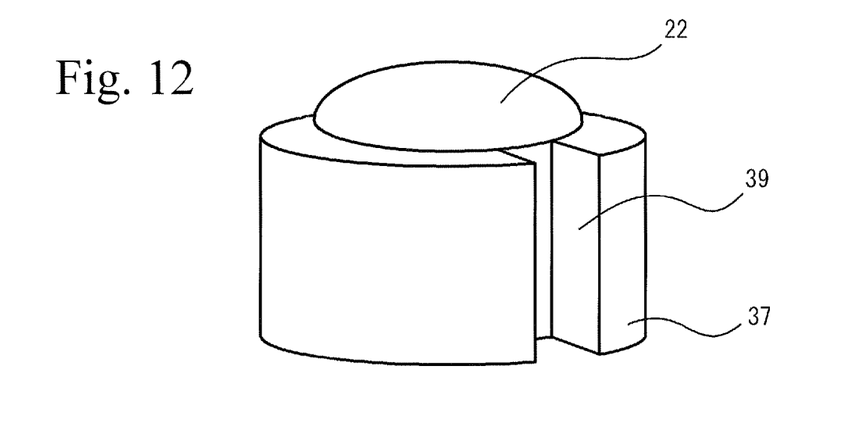
FIG. 12 is a perspective view of a terminal employed in a surface acoustic wave device in accordance with a third embodiment.

FIG. 12 is a perspective view of a structure of the terminal 20 employed in a third embodiment. The terminal 20 shown in FIG. 12 has the non-coating portion 39 having a slit shape through which the side surface of the protrusion electrode 22 is exposed. The other structures of the terminal 20 shown in FIG. 12 are the same as those of the first embodiment shown in FIGS. 5A and 5B.

The acoustic wave device 40 of the third embodiment is mounted on the electronic circuit board 26 and solder reflow is performed with a load being applied to the device 40. Solder primarily flows out of the slit of the non-coating portion 39. It is thus possible to control solder flowing out not only in the horizontal direction but also in the vertical direction.

Fourth Embodiment

Figure 13:
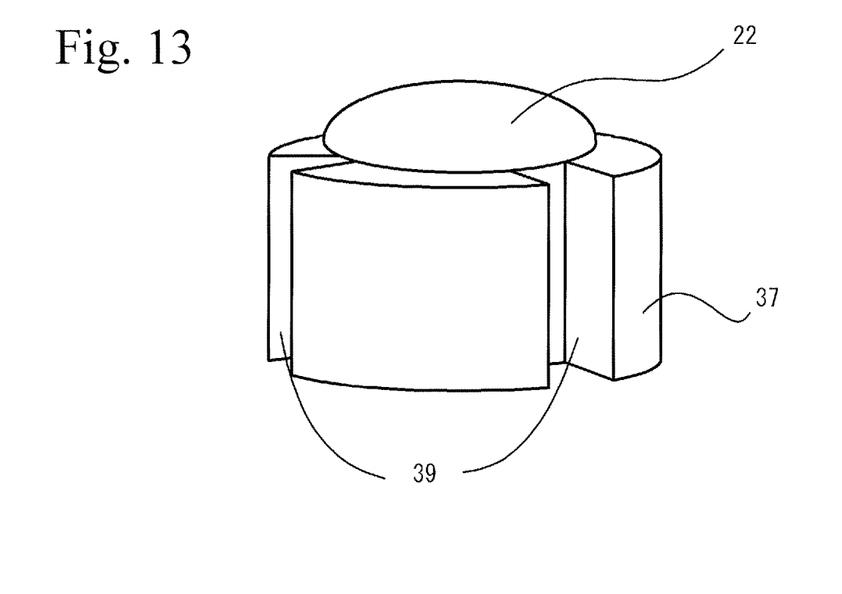
FIG. 13 is a perspective view of a terminal employed in a surface acoustic wave device in accordance with a fourth embodiment.

FIG. 13 is a perspective view of a structure of the terminal 20 employed in a fourth embodiment. The terminal 20 shown in FIG. 13 has two non-coating portions 39 having a slit shape through which the side surface of the protrusion electrode 22 is exposed. The other structures of the terminal 20 shown in FIG. 13 are the same as those of the first embodiment shown in FIGS. 5A and 5B.

The acoustic wave device 40 of the fourth embodiment is mounted on the electronic circuit board 26 and solder reflow is performed with a load being applied to the device 40. Solder primarily flows out of the two slits of the non-coating portions 39. It is thus possible to reduce the mount of solder flowing out, as compared to the third embodiment and to more reliably prevent the terminals 20 from being short-circuited, as compared to the third embodiment. Further, a small amount of solder flows out of each of the two non-coating portions 39 formed by the slits, as compared to the third embodiment. Thus, the shape of the terminals 20 of the fourth embodiment is not deformed as much as that in the third embodiment. It is thus possible for the resin 30 for transfer mold to more smoothly flow in the standoff 32 between the acoustic wave device and the electronic circuit board 26 when the device is sealed with the resin 30.

The above-mentioned terminal 20 employed in the fourth embodiment has two slit-like non-coating portions 39. Similar effects may be obtained by using the non-coating portions 39 that have the cutout shapes or through holes. Further, similar advantages may be obtained when three or more non-coating portions 39 that have the cutout shapes, through holes or slits. Furthermore, similar advantages may be obtained by any combinations of two different types of non-coating portions 39.

The shapes of the non-coating holes are not limited to cutout, through hole and slits, but may be shaped into another shape capable of controlling the direction in which solder flows out.

The top of the terminals 20 used in any of the first through fourth embodiments is not limited to a circular shape but may be an oval, rectangular or polygonal shape or the like.

The present invention is not limited to the specifically disclosed embodiment, but other embodiments and variations may be made without departing from the scope of the present invention.

The present application is based on Japanese Patent Application No. 2006-311548 filed on Nov. 17, 2006, the entire disclosure of which is hereby incorporated by reference.

What is claimed is:

1. An acoustic wave device comprising:
    an acoustic wave element formed on a piezoelectric substrate; and
    a terminal that makes an electric connection with an outside of the acoustic wave device,
    the terminal having a protrusion electrode having a side surface coated with a coating film having a non-coating portion.

2. The acoustic wave device as claimed in claim 1, wherein the protrusion electrode is made of a material that is melted at the time of mounting the acoustic wave device, and the coating layer is made of another material capable of maintaining a shape of the coating layer at the time of mounting the acoustic wave device.

3. The acoustic wave device as claimed in claim 1, further comprising another terminal configured like the terminal, wherein the non-coating portion of said terminal and a non-coating portion of said another terminal are provided so as not to face each other.

4. The acoustic wave device as claimed in claim 1, wherein the coating film has a first thickness in a region that the non-coating region contacts and a second thickness in another region that the non-coating region does not contact, the first thickness being greater than the second thickness.

5. The acoustic wave device as claimed in claim 1, wherein the non-coating portion has a cutout shape.

6. The acoustic wave device as claimed in claim 1, wherein the non-coating portion has a through hole.

7. The acoustic wave device as claimed in claim 1, wherein the non-coating portion has a slit.

8. The acoustic wave device as claimed in claim 1, wherein the coating layer is made of resin.

9. The acoustic wave device as claimed in claim 1, wherein the protrusion electrode is made of solder.

* * * * *